(12) United States Patent
Li et al.

(10) Patent No.: US 11,839,032 B2
(45) Date of Patent: Dec. 5, 2023

(54) MULTI HEAD FLEXIBLE PRINTED CIRCUIT ULTRAVIOLET LASER DRILLING DEVICE AND METHOD

(71) Applicant: WUHAN HERO OPTOELECTRONICS TECHNOLOGY CO., LTD., Wuhan (CN)

(72) Inventors: Xuelian Li, Wuhan (CN); Tao Peng, Wuhan (CN); Qiubing Ran, Wuhan (CN)

(73) Assignee: WUHAN HERO OPTOELECTRONICS TECHNOLOGY CO., LTD., Wuhan (CN)

( * ) Notice: Subject to any disclaimer, the term of this patent is extended or adjusted under 35 U.S.C. 154(b) by 38 days.

(21) Appl. No.: 17/861,126

(22) Filed: Jul. 8, 2022

(65) Prior Publication Data
US 2023/0240019 A1  Jul. 27, 2023

(30) Foreign Application Priority Data
Jan. 21, 2022 (CN) .......................... 202210073082.7

(51) Int. Cl.
*H05K 3/32* (2006.01)
*H05K 3/00* (2006.01)

(52) U.S. Cl.
CPC .......... *H05K 3/326* (2013.01); *H05K 3/0026* (2013.01); *H05K 3/0047* (2013.01)

(58) Field of Classification Search
CPC .......... H05K 3/00; H05K 3/32; H05K 3/0047; H05K 3/0026; H05K 3/326

USPC .......................................................... 174/85
See application file for complete search history.

(56) References Cited

U.S. PATENT DOCUMENTS

| | | | | |
|---|---|---|---|---|
| 6,720,524 B1* | 4/2004 | Hamada | ............... | H05K 3/0026 219/121.7 |
| 2003/0047544 A1* | 3/2003 | De Steur | ............. | H05K 3/0032 219/121.71 |
| 2004/0140299 A1* | 7/2004 | Arai | ..................... | H05K 3/0026 219/121.71 |
| 2008/0049285 A1* | 2/2008 | Pinard | .................. | B23K 26/382 359/202.1 |
| 2023/0309241 A1* | 9/2023 | Cormier | ............. | H05K 13/0092 29/825 |

* cited by examiner

*Primary Examiner* — Tremesha S Willis
(74) *Attorney, Agent, or Firm* — Zhigang Ma

(57) ABSTRACT

A multi head flexible printed circuit (FPC) ultraviolet laser drilling device and a using method thereof are provided, the device includes a body frame; a support frame connected to the body frame; a first movement assembly disposed on the body frame and configured to move along a Y-axis direction of the body frame; a second movement assembly disposed on the support frame and configured to move along an X-axis direction of the body frame; a third movement assembly disposed on the second movement assembly and configured to move along a Z-axis direction of the body frame; a suction assembly slidably connected to the first movement assembly and configured to fix one or more FPC boards; and a drilling assembly including drilling parts. The device can realize the simultaneous processing of FPC board by adopting two or more processing modes, thereby improving the processing efficiency.

10 Claims, 2 Drawing Sheets

MULTI HEAD FLEXIBLE PRINTED CIRCUIT ULTRAVIOLET LASER DRILLING DEVICE AND METHOD

TECHNICAL FIELD

The disclosure relates to a field of laser drilling technologies, in particular to a multi head flexible printed circuit (FPC) ultraviolet laser drilling device and a using method thereof.

BACKGROUND

A flexible electronic material board is a kind of printed circuit board with high reliability and flexibility, which is made of flexible substrates such as polyimide (PI) or polyester (PET) films. The flexible electronic material board is called a flexible board or a flexible printed circuit (FPC) for short, and has the characteristics of high wiring density, lightweight and thin thickness.

At present, with the rapid development of science and technology and the popularization of electronic products, the application of the FPC involves almost all electronic information products, including consumer electronic products, communication equipment, automotive products and other fields.

With the continuous development of the FPC, a mechanical drilling technology cannot meet the market demand of drilling which needs small diameter, high precision and high efficiency. Laser drilling has gradually replaced the mechanical drilling. At present, most of laser drilling equipment in the market are processed in a single head processing mode, which cannot meet the processing efficiency requirements of the FPC.

SUMMARY

A purpose of the disclosure is to provide a multi head FPC ultraviolet laser drilling device and a using method thereof, so as to solve problems existing in the prior art. The disclosure can realize a processing of the FPC board by adopting a multi head processing mode and improve the processing efficiency.

To achieve the above purpose, the disclosure provides a following scheme: the disclosure provides a multi head FPC ultraviolet laser drilling device, including a body frame and a support frame, and a top end of the body frame is fixedly connected to a bottom end of the support frame; the device further includes:
- a first movement assembly, disposed on the body frame, the first movement assembly being configured to move along a Y-axis direction of the body frame, and the first movement assembly including first driving parts arranged in parallel;
- a second movement assembly, disposed on the support frame, the second movement assembly being disposed above the first movement assembly, and the second movement assembly being configured to move along an X-axis direction of the body frame;
- a third movement assembly, disposed on the second movement assembly, the third movement assembly being configured to move along a Z-axis direction of the body frame;
- a suction assembly, including suction parts, the first driving parts being slidably connected to the suction parts respectively, the suction parts being configured to fix one or more FPC boards and move along the Y-axis direction of the body frame through the first driving parts; and
- a drilling assembly, including drilling parts, the drilling parts being fixed on the third movement assembly, and the drilling parts being arranged corresponding to the one or more FPC boards and being configured to drill the one or more FPC boards.

In an embodiment, the first driving parts include Y-axis driving rails respectively, bottom ends of the Y-axis driving rails are fixedly connected to a top end of the body frame, top ends of the Y-axis driving rails are slidably connected to Y-axis movers respectively, and top ends of the Y-axis movers are fixedly connected to the suction parts respectively.

In an embodiment, the second movement assembly includes an X-axis driving rail, the X-axis driving rail is fixedly connected to the support frame, the X-axis driving rail is slidably connected to X-axis movers, and the X-axis movers are fixedly connected to the third movement assembly.

In an embodiment, the third movement assembly includes Z-axis lifters, the Z-axis lifters are fixedly connected to the X-axis movers respectively, and the Z-axis lifters are arranged corresponding to the one or more FPC boards.

In an embodiment, the suction parts include negative pressure suckers fixedly connected to top ends of the Y-axis movers respectively, top ends of the negative pressure suckers are provided with cover plates containing micropores, the one or more FPC boards are disposed on the negative pressure suckers through the cover plates, each of the negative pressure suckers is provided with supporting columns of the cover plate, and the one or more FPC boards are fixed with the negative pressure suckers through the cover plates.

In an embodiment, the drilling parts include laser devices respectively, the laser devices are fixedly connected to a top end of the support frame, the laser devices are electrically connected to vibrating mirrors, the vibrating mirrors are fixedly connected to the Z-axis lifters, the vibrating mirrors are arranged corresponding to a top end of the one or more FPC boards.

In an embodiment, the laser device is a pulse ultraviolet laser device.

In an embodiment, a side wall of the negative pressure sucker fixed on the Y-axis mover is fixedly connected to a laser power probe.

A method of using the multi head FPC ultraviolet laser drilling device, includes:
- S1, fixing the one or more FPC boards: placing the one or more FPC boards on negative pressure suckers and fixing the one or more FPC boards;
- S2, adjusting a Y-axis position of the one or more FPC boards: starting Y-axis movers to move the one or more FPC boards to a specified position;
- S3, adjusting X-axis positions of the drilling parts: starting X-axis movers and Z-axis lifters to move the drilling parts to specified positions;
- S4, drilling into the one or more FPC boards: starting the drilling parts to drill into the one or more FPC boards; and
- S5, replacing the one or more FPC boards: resetting positions of the X-axis movers, the Z-axis lifters, and the Y-axis movers, and removing fixations of the negative pressure suckers to the one or more FPC boards, and then repeating the steps of S1 to S5.

In an embodiment, in the step S1, the negative pressure suckers are fixed on the more FPC boards respectively; or the negative pressure suckers are fixed on the one FPC board.

The disclosure discloses the following technical effects.

1. By a disposition of the first driving parts, the FPC boards can be placed on the first driving parts respectively. Under effects of the second movement assembly and the third movement assembly, the drilling assembly can drill the FPC boards at the same time. This process takes short time and has a high processing efficiency.

2. The suction part can better fix and disassemble the FPC board, and it is more convenient to fix and disassemble the FPC board, thus improving the processing efficiency.

3. In the scheme, the suction parts can fix the FPC boards respectively to process the FPC boards synchronous, or the suction parts can jointly fix the one FPC board to process the one FPC board, which can be applicable to the FPC boards of different sizes and reduce the processing costs.

BRIEF DESCRIPTION OF DRAWINGS

In order to more clearly explain the embodiments of the disclosure or the technical schemes in the prior art, the following will briefly introduce some drawings that need to be used in the embodiments. It is obvious that the drawings described below are only some embodiments of the disclosure. For those skilled in the art, other drawings can be obtained from these drawings without creative work.

DESCRIPTION OF REFERENCE NUMERALS

1—body frame, 2—support frame, 3—Y—axis driving rail, 4—Y—axis mover, 5—X—axis driving rail, 6—X—axis mover, 7—Z—axis lifter, 8—negative pressure sucker, 9—supporting column of cover plate, 10—laser device, 11—vibrating mirror, 12—laser power probe, 13—dust cover, 14—lifting motor, 15—mounting plate, 16—Charge Coupled Device (CCD) positioning system.

DETAILED DESCRIPTION OF EMBODIMENTS

The technical schemes in the embodiments of the disclosure will be clearly and completely described below in combination with the drawings in the embodiments of the disclosure. Obviously, the described embodiments are only part of the embodiments of the disclosure, not all of them. Based on the embodiments of the disclosure, all other embodiments obtained by those skilled in the art without making creative work belong to the protection scope of the disclosure.

In order to make the above purposes, characteristics and advantages of the disclosure more obvious and easy to understand, the disclosure is described in further details below in a combination with the attached drawings and specific embodiments.

Figure 1:
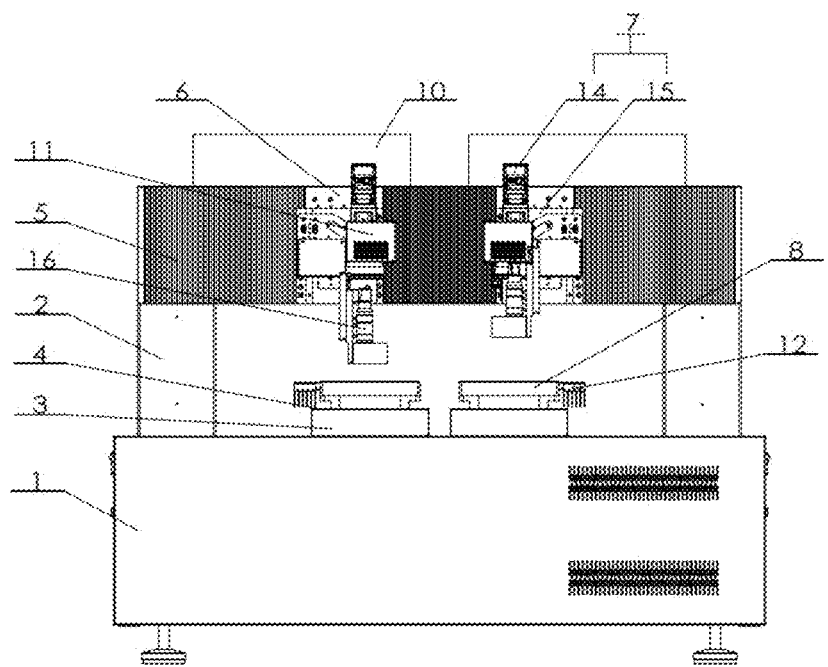
FIG. 1 is a front view of a multi head FPC ultraviolet laser drilling device.
Figure 2:
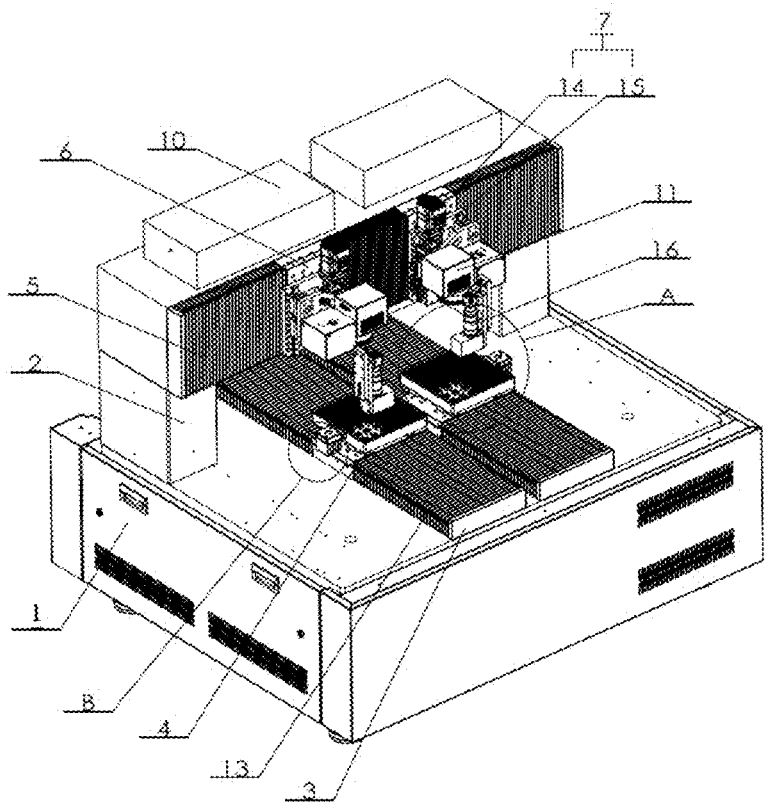
FIG. 2 is a stereoscopic view of the multi head FPC ultraviolet laser drilling device.
Figure 3:
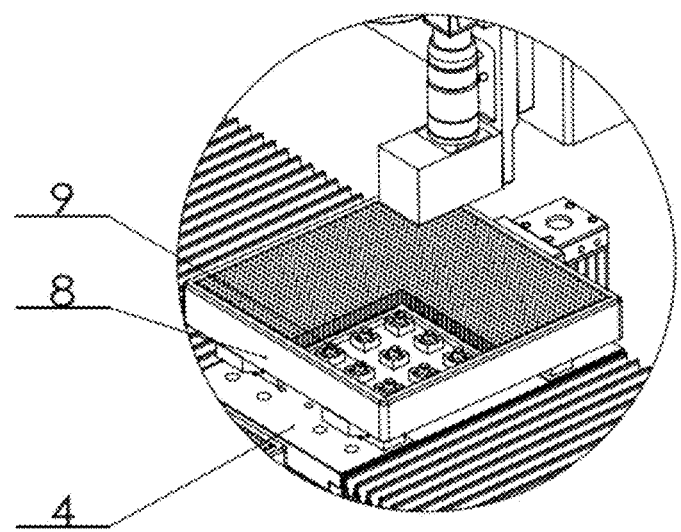
FIG. 3 is a partial enlarged view at A in FIG. 2.
Figure 4:
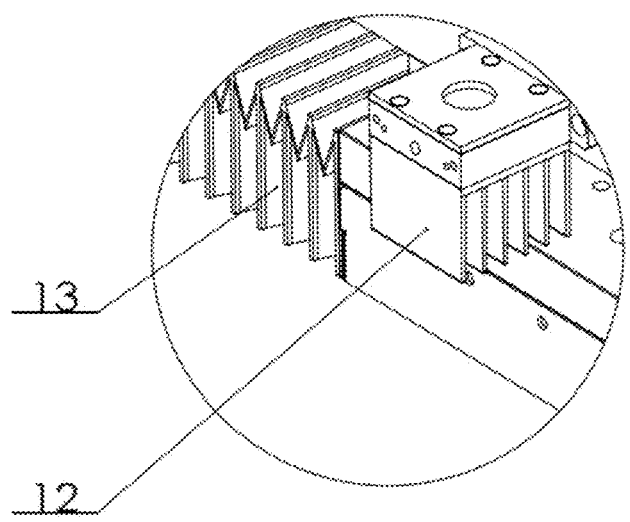
FIG. 4 is a partial enlarged view at B in FIG. 2.

As shown in FIG. 1 to FIG. 4, the disclosure provides a multi head FPC ultraviolet laser drilling device, including a body frame 1 and a support frame 2, and a top end of the body frame 1 is fixedly connected to a bottom end of the support frame 2; the device further includes:

a first movement assembly, disposed on the body frame 1, the first movement assembly being configured to move along a Y-axis direction of the body frame 1, and the first movement assembly including first driving parts arranged in parallel;

a second movement assembly, disposed on the support frame 2, the second movement assembly being disposed above the first movement assembly, and the second movement assembly being configured to move along an X-axis direction of the body frame 1;

a third movement assembly, disposed on the second movement assembly, the third movement assembly being configured to move along a Z-axis direction of the body frame 1;

a suction assembly, including suction parts, the first driving parts being slidably connected to the suction parts respectively, the suction parts being configured to fix one or more FPC boards, and the suction parts being configured to move along the Y-axis direction of the body frame through the first driving parts; and a drilling assembly, including drilling parts, the drilling parts being fixed on the third movement assembly, and the drilling parts being arranged corresponding to the one or more FPC boards and being configured to drill the one or more FPC boards.

Selecting an FPC board which is to be processed, placing the FPC board on the suction part on the first driving part, fixing the FPC board through the suction part, and then the first driving part starts to transport the suction part together with the FPC board to a specified position, then the second movement assembly and the third movement assembly start to work, the second movement assembly transports the drilling assembly to the position to be drilled, and the third movement assembly is used to adjust the height of the drilling assembly so that the drilling assembly can make the required holes. After drilling the FPC board, the second movement assembly, the third movement assembly and the first driving part are reset to make the FPC board return to its original position. Then, the FPC board is released and replaced by the operator.

In an embodiment of the disclosure, multi heads are any cascade of two or more heads.

In an embodiment, the first driving parts include Y-axis driving rails 3 respectively, bottom ends of the Y-axis driving rails 3 are fixedly connected to a top end of the body frame 1, top ends of the Y-axis driving rails 3 are slidably connected to Y-axis movers 4 respectively, and top ends of the Y-axis movers 4 are fixedly connected to the suction parts respectively. The Y-axis drive rails 3 have a limiting effect, making the Y-axis movers 4 move along a direction of the Y-axis drive rails 3, thereby driving the suction parts to move.

In an embodiment, the Y-axis movers 4 are provided with driving motors respectively (not shown in the figures), and the driving motors are used to provide power to drive the Y-axis movers 4. The connection and usage mode of each of the Y-axis movers 4 and corresponding one of the Y-axis driving rails 3 can be based on the existing technology, and these will not be repeated here.

In an embodiment, opposite sides of each of the Y-axis drive rails 3 are respectively fixedly provided with dust covers 13. Since dust will appear during laser drilling, the dust covers 13 can isolate the dust to prevent the dust from spreading into the rails.

In an embodiment, the second movement assembly includes an X-axis driving rail 5, the X-axis driving rail is fixedly connected to the support frame 2, the X-axis driving rail is slidably connected to X-axis movers, and the X-axis movers are fixedly connected to the third movement assembly. The X-axis movers 6 share the same X-axis driving rail 5 to save space.

In an embodiment, the X-axis movers 6 can move synchronously to take a synchronous drilling operation on the FPC boards, that is, the FPC boards are loaded and unloaded at the same time, which improves the accuracy of drilling on the one hand, and improves the efficiency of loading and unloading on the other hand.

In an embodiment, the third movement assembly includes Z-axis lifters 7, the Z-axis lifters 7 are fixedly connected to the X-axis movers 6 respectively, and the Z-axis lifters 7 are arranged corresponding to the one or more FPC boards. The Z-axis lifter 7 is used to adjust a distance between the drilling assembly and the FPC board, to drill suitable holes.

In an embodiment, the Z-axis lifter 7 includes a lifting motor 14 and a mounting plate 15. The lifting motor 14 is used to adjust the height of the mounting plate 15, and the drilling part is disposed on the mounting plate 15 to facilitate the height adjustment of the drilling part.

In an embodiment, each of the suction parts includes a negative pressure sucker 8 fixedly connected to a top end of the Y-axis mover 4, a top end of the negative pressure sucker 8 is provided with a cover plate containing micropores, the one or more FPC boards are disposed on the negative pressure suckers 8 through the cover plates, the negative pressure sucker 8 is provided with supporting columns of the cover plate 9, and the one or more FPC boards are fixed with the negative pressure suckers 8 through the cover plates. When the negative pressure sucker 8 fixes the FPC board, placing the FPC board on the cover plate of the negative pressure sucker 8, and then starting the negative pressure sucker 8 to extract air to fix the FPC board. When the negative pressure suckers 8 fixes one FPC board, it is only necessary to replace the negative pressure sucker 8, through replacing the negative pressure sucker 8 with a large-size negative pressure sucker 8, the processing to a large-size FPC board can be achieved.

In an embodiment, the drilling part includes a laser device 10, the laser device 10 is fixedly connected to a top end of the support frame 2, the laser device is electrically connected to a vibrating mirror 11, the vibrating mirror 11 is fixedly connected to the Z-axis lifter 7, the vibrating mirrors 11 of the drilling parts are arranged corresponding to a top end of the one or more FPC boards. The laser device 10 emits the laser, and the laser meeting the drilling conditions are derived through the vibrating mirror 11, and then the FPC board is drilled.

In an embodiment, the mounting plate 15 is provided with a CCD positioning system 16. The CCD positioning system 16 is used to determine a position of the FPC board and a drilling position, and feed them back to a control center (not shown in the figure). The control center controls the drilling parts to move to a specified position and perform drilling operations.

In an embodiment, there are several sets of the CCD positioning system 16, a set of the CCD positioning system 16 corresponds to a Y-axis mover 4.

In an embodiment, several sets of the CCD positioning systems 16 work independently to complete the positioning of each drilling part.

In an embodiment, the laser device 10 is a pulsed UV laser device 10. Compared with a traditional laser, the pulsed UV laser has faster speed and can make the energy more concentrated, so as to improve the drilling effect.

In an embodiment, a side wall of the negative pressure sucker 8 disposed on the Y-axis movers 4 is fixedly connected with a laser power probe 12. The laser power probe 12 is used to monitor the laser power and ensure the consistency of drilling power, so as to ensure the consistency of drilling.

A method of using the multi head FPC ultraviolet laser drilling device has the following steps.

S1, fixing the one or more FPC boards: placing the one or more FPC boards on negative pressure suckers 8 and fixing the one or more FPC boards; placing the one or more FPC boards on the cover plates of the negative pressure suckers 8, starting the negative pressure suckers 8, and fixing the one or more FPC boards by extracting air.

S2, adjusting a Y-axis position of the one or more FPC boards: starting Y-axis movers 4 to move the one or more FPC boards to a specified position. The Y-axis movers 4 work to move the one or more FPC boards to a predetermined position. After the one or more FPC boards are moved to the predetermined position, the CCD positioning systems 16 measure the position of the one or more FPC boards, due to different FPC boards will have position errors caused by a manual operation, the FPC board is measured through the CCD positioning system 16 and adjusted accordingly.

S3, adjusting X-axis positions of drilling parts: starting X-axis movers 6 and Z-axis lifters 7 to move the drilling parts to a specified position. Under an effect of the CCD positioning system 16, the vibrating mirrors 11 are transmitted to a position to be drilled.

S4, drilling into the one or more FPC boards: starting the drilling parts to drill into the one or more FPC boards. Starting the laser device 10, the laser emitted by the laser device 10 is emitted again through the vibrating mirror 11 to drill holes in the FPC board.

S5, replacing the one or more FPC boards: resetting positions of the X-axis movers 6, the Z-axis lifters 7, and the Y-axis movers 4, and removing a fixation of the negative pressure suckers 8 to the one or more FPC boards, and then repeating the steps of S1 to S5. After the drilling is completed, resetting the X-axis movers 6, lifting motors 14 and Y-axis movers 4, cancelling the fixation of the negative pressure suckers 8 on the one or more FPC boards, and replacing the FPC board with a new one.

In an embodiment, in the step S1, the negative pressure suckers can fix the more FPC board respectively; or the negative pressure suckers can fix the one FPC board. When it is necessary to process a large-size FPC board, replacing the negative pressure sucker 8 to fix the large-size FPC board. That is, the device can fix the large-size FPC board through the negative pressure suckers 8. Such as, when it is necessary to fix the large-size FPC board, combining the two Y-axis movers 4, then disposing the negative pressure suckers 8 on the combined Y-axis movers 4, fixing the large-size FPC board through the negative pressure suckers 8, and the two drilling parts corresponding to the two Y-axis movers 4 can drill holes on the same large-size FPC board.

In the description of the disclosure, it should be noted that orientation or position relationships indicated by terms "longitudinal", "lateral", "upper", "lower", "front", "rear", "left", "right", "vertical", "horizontal", "top", "bottom", "inner", "outer" and so on are based on orientation or position relationships shown in the illustrated drawings, only for a convenience of describing the disclosure, rather than indicating or implying that a device or a unit referred must have a specific orientation, construction and operation based on a specific orientation, and it cannot be understood as a limitation of the disclosure.

The above described embodiments only describe some embodiments of the disclosure, and do not limit a scope of the disclosure. Without departing from a design spirit of the disclosure, various modifications and improvements made by those skilled in the art to a technical scheme of the disclosure should be in the protection scope determined by the claims of the disclosure.

What is claimed is:

1. A multi head flexible printed circuit (FPC) ultraviolet laser drilling device, comprising: a body frame and a support frame, and a top end of the body frame being fixedly connected to a bottom end of the support frame, wherein the device further comprises:
    a first movement assembly, disposed on the body frame, wherein the first movement assembly is configured to move along a Y-axis direction of the body frame, and the first movement assembly comprises first driving parts arranged in parallel;
    a second movement assembly, disposed on the support frame, wherein the second movement assembly is disposed above the first movement assembly, and the second movement assembly is configured to move along an X-axis direction of the body frame;
    a third movement assembly, disposed on the second movement assembly, wherein the third movement assembly is configured to move along a Z-axis direction of the body frame;
    a suction assembly, comprising suction parts, wherein the first driving parts are slidably connected to the suction parts respectively, the suction parts are configured to fix one or more FPC boards and move along the Y-axis direction of the body frame through the first driving parts; and
    a drilling assembly, comprising drilling parts, wherein the drilling parts are fixed on the third movement assembly, and the drilling parts are arranged corresponding to the one or more FPC boards and configured to drill the one or more FPC boards.

2. The multi head FPC ultraviolet laser drilling device according to claim 1, wherein the first driving parts comprise Y-axis driving rails respectively, bottom ends of the Y-axis driving rails are fixedly connected to a top end of the body frame, top ends of the Y-axis driving rails are slidably connected to Y-axis movers respectively, and top ends of the Y-axis movers are fixedly connected to the suction parts respectively.

3. The multi head FPC ultraviolet laser drilling device according to claim 1, wherein the second movement assembly comprises an X-axis driving rail, the X-axis driving rail is fixedly connected to the support frame, the X-axis driving rail is slidably connected to X-axis movers, and the X-axis movers are fixedly connected to the third movement assembly.

4. The multi head FPC ultraviolet laser drilling device according to claim 3, wherein the third movement assembly comprises Z-axis lifters, the Z-axis lifters are fixedly connected to the X-axis movers respectively, and the Z-axis lifters are arranged corresponding to the one or more FPC boards.

5. The multi head FPC ultraviolet laser drilling device according to claim 2, wherein the suction parts comprise negative pressure suckers fixedly connected to top ends of the Y-axis movers respectively, top ends of the negative pressure suckers are provided with cover plates containing micropores, the one or more FPC boards are disposed on the negative pressure suckers through the cover plates, each of the negative pressure suckers is provided with supporting columns of the cover plate, and the one or more FPC boards are fixed with the negative pressure suckers through the cover plates.

6. The multi head FPC ultraviolet laser drilling device according to claim 4, wherein the drilling parts comprise laser devices respectively, the laser devices are fixedly connected to a top end of the support frame, the laser devices are electrically connected to vibrating mirrors, the vibrating mirrors are fixedly connected to the Z-axis lifters, the vibrating mirrors are arranged corresponding to a top end of the one or more FPC boards.

7. The multi head FPC ultraviolet laser drilling device according to claim 6, wherein one of the laser devices is a pulse ultraviolet laser device.

8. The multi head FPC ultraviolet laser drilling device according to claim 5, wherein a side wall of one of the negative pressure suckers fixed on the Y-axis movers is fixedly connected to a laser power probe.

9. A method of using the multi head FPC ultraviolet laser drilling device according to claim 1, wherein the method comprises:
    S1, fixing the one or more FPC boards: placing the one or more FPC boards on negative pressure suckers and fixing the one or more FPC boards;
    S2, adjusting a Y-axis position of the one or more FPC boards: starting Y-axis movers to move the one or more FPC boards to a specified position;
    S3, adjusting X-axis positions of the drilling parts: starting X-axis movers and Z-axis lifters to move the drilling parts to specified positions;
    S4, drilling into the one or more FPC boards: starting the drilling parts to drill into the one or more FPC boards; and
    S5, replacing the one or more FPC boards: resetting positions of the X-axis movers, the Z-axis lifters, and the Y-axis movers, and removing fixations of the negative pressure suckers to the one or more FPC boards, and then repeating the steps of S1 to S5.

10. The method according to claim 9, wherein in the step S1, the FPC boards are fixed on the negative pressure suckers respectively; or the one FPC board is fixed on the negative pressure suckers.

* * * * *